United States Patent
Takahara et al.

(10) Patent No.: US 9,199,793 B2
(45) Date of Patent: Dec. 1, 2015

(54) STORAGE SYSTEM AND STORAGE METHOD

(71) Applicant: Daifuku Co., Ltd., Osaka-shi (JP)

(72) Inventors: Masahiro Takahara, Gamo-gun (JP); Toshihito Ueda, Gamo-gun (JP)

(73) Assignee: Daifuku Co., Ltd., Osaka-shi (JP)

(*) Notice: Subject to any disclaimer, the term of this patent is extended or adjusted under 35 U.S.C. 154(b) by 0 days.

(21) Appl. No.: 14/310,153

(22) Filed: Jun. 20, 2014

(65) Prior Publication Data
US 2015/0003941 A1 Jan. 1, 2015

(30) Foreign Application Priority Data
Jun. 26, 2013 (JP) .................. 2013-134270

(51) Int. Cl.
*G06F 7/00* (2006.01)
*B65G 1/16* (2006.01)
*H01L 21/67* (2006.01)
*H01L 21/677* (2006.01)

(52) U.S. Cl.
CPC ............ *B65G 1/16* (2013.01); *H01L 21/67276* (2013.01); *H01L 21/67733* (2013.01); *H01L 21/67769* (2013.01)

(58) Field of Classification Search
None
See application file for complete search history.

(56) References Cited

U.S. PATENT DOCUMENTS

| 6,050,768 A * | 4/2000 | Iwasaki ............. H01L 21/67276 414/222.01 |
| 6,123,120 A | 9/2000 | Yotsumoto et al. |
| 6,240,335 B1 * | 5/2001 | Wehrung ........... G05B 19/4189 198/571 |
| 2002/0124906 A1* | 9/2002 | Suzuki .............. H01L 21/67017 141/98 |
| 2012/0065763 A1* | 3/2012 | Asai .................... G05B 23/0221 700/108 |

FOREIGN PATENT DOCUMENTS

| JP | 11168135 A | 6/1999 |
| JP | 11292219 A | 10/1999 |
| JP | 11334810 A | 12/1999 |
| JP | 200519911 A | 1/2005 |
| JP | 200948588 A | 3/2009 |
| JP | 201225557 A | 2/2012 |

* cited by examiner

*Primary Examiner* — Yolanda Cumbess
(74) *Attorney, Agent, or Firm* — The Webb Law Firm

(57) ABSTRACT

A storage system comprises a storage structure having storage sections and a carry-in-and-out portion, one or more environment adjusters for adjusting storage environment individually for each of the storage sections, an environment managing portion for collecting information about storage environment and controls operation of the one or more environment adjusters, a storage transport device for performing a transport operation, and a carry-in-and-out managing device for managing the locations of storage sections.

10 Claims, 8 Drawing Sheets

Fig.3

| Identification number | Management information |
|---|---|
| 01 | Stacker crane start up |
| 02 | Stacker crane operating |
| 03 | Transfer completed |
| 04 | Stacker crane standing by |
| 05 | Container ID read |
| 06 | Container standing by |
| 07 | Container being transported |
| 08 | Container carry in completed |
| 09 | Container take out completed |
| 11 | Purging discontinued |
| 12 | Purging started |
| 13 | Purging completed |
| 14 | Purging status changed |

STORAGE SYSTEM AND STORAGE METHOD

CROSS-REFERENCE TO RELATED APPLICATION

This application claims priority to Japanese Patent Application No. 2013-134270 filed Jun. 26, 2013, the disclosure of which is hereby incorporated in its entirety by reference.

FIELD OF THE INVENTION

The present invention relates to a storage system comprising, a storage structure having a plurality of storage sections for storing article holders for transporting articles and a carry-in-and-out portion for carrying in and carrying out the article holders, one or more environment adjusters for adjusting storage environment of the articles held by the article holders in the storage sections, with the adjusting performed individually for each of the storage sections, an environment managing portion for collecting information about the storage environment of the articles in each of the plurality of storage sections, and for controlling operation of the one or more environment adjusters, a storage transport device for performing a carry out transport operation in which the article holder is transported from the storage section to the carry-in-and-out portion, and a carry in transport operation in which the article holder is transported from the carry-in-and-out portion to the storage section, a primary managing device for outputting a carry out request for carrying out the article holder specified by identifying information provided to each of the article holders from the storage structure, and a carry in request for carrying in the article holder specified by the identifying information to the storage structure, a carry-in-and-out managing device for managing locations of the storage sections in which the article holders are stored, by associating the locations of the storage sections in which the article holders are stored with the identifying information of the respective article holders, and for controlling the carry out transport operation or the carry in transport operation of the storage transport device based on the carry out request or the carry in request. The present invention also relates to a storage method utilizing such storage system.

BACKGROUND

An example of a storage system, such as one described above, that has an environment adjuster for adjusting, for each storage section, storage environment of the articles held in article holders in storage sections is described in JP Publication of Application No. H11-168135 (Patent Document 1). The storage system of Patent Document 1 is a system which stores article transporting containers which hold a plurality of semiconductor substrates that need to be stored in an inactive gas atmosphere.

The storage system of Patent Document 1 includes, as the environment adjuster and for each storage section, an inactive gas supplying device which supplies inactive gas to the transporting container stored in a storage sections. And an environment managing portion (the controller 20 in Patent Document 1) collects information about the storage environment for the semiconductor substrates, such as opening and closing information for valves in supply pipes, supply pressure information for inactive gas, and supply flow rate information, and controls operations of the plurality of the inactive gas supplying devices, for each storage section.

Other examples of storage systems having an environment adjuster are described in JP Publication of Application No. 2009-48588 (Patent Document 2) and JP Publication of Application No. 2012-25557 (Patent Document 3). The storage system of Patent Document 2 and Patent Document 3 is a system for storing article transporting magazines that hold a plurality of rechargeable battery cells (see Paragraph [0013] in Patent Document 2).

In the case of the storage systems which store magazines for rechargeable battery cells such as ones disclosed in Patent Documents 2 and Patent Document 3, each storage section is provided with a charging device, which functions as an environment adjuster, which supplies electric current to the magazine stored in the storage section. And an environment managing portion collects information about the storage environment of the rechargeable battery cells, such as information about operating state of the charging devices, temperature in the storage sections, and existence of smoke in the storage sections, and controls operation of the plurality of charging devices for each storage section.

The storage transport devices, which the storage systems of Patent Documents 1-3 have, perform carry out transport operations in which article holders are transported from storage sections in the storage structure to a carry-in-and-out portion, and carry in transport operations in which article holders are transported from the carry-in-and-out portion to storage sections. The carry out transport operation and the carry in transport operation of the storage transport device are controlled by a carry-in-and-out managing device. While not described in detail in Patent Documents 1-3, in order for the carry-in-and-out managing device to manage, or keep track of, which article holder is stored in which storage section, the managing device manages, or keeps track of, the location of the storage section in which a given article holder is stored such that the location is associated with the identifying information of the article holder.

The carry-in-and-out managing device controls carry out transport operation and carry in transport operation of the storage transport device based on a carry out request for retrieving, or carrying out, an article holder from the storage structure and a carry in request for storing, or carrying in, an article holder to the storage structure. A superordinate primary managing device outputs these carry out requests and carry in requests, as described, for example, in JP Publication of Application No. 2005-19911 (Patent Document 4). More specifically, the primary managing device outputs to the carry-in-and-out managing device a carry out request for retrieving, or carrying out, an article holder specified by means of the identifying information provided to each article holder, from the storage structure, or a carry in request for storing, or carrying in, an article holder specified by the identifying information, to the storage structure, in order to have the specified article holder carried into the storage structure, or to have the specified article holder carried out from the storage structure.

In the storage systems described above, when the storage environment of the articles held in the article holders undergoes significant changes in terms of the quality control of the articles, the carry-in-and-out managing device controls the operation of the carry-in-and-out transport device based on the information about the storage environment obtained from the environment managing portion. For example, in the storage system of Patent Document 2, when abnormal condition occurs in the storage environment in a storage section, the article holder stored in that storage section is retrieved and moved to a predetermined location by the storage transport device. Incidentally, Patent Document 2 describes an example in which the carry-in-and-out managing device also has the function of the environment managing portion.

SUMMARY OF THE INVENTION

In a storage system such as ones described above, the carry-in-and-out managing device controls the operation of the carry-in-and-out transport device based on the information about the storage environment obtained from the environment managing portion when the storage environment of the articles held in the article holders undergoes significant changes in terms of the quality control of the articles. However, information on the storage environment of the articles held in article holders in storage sections is not transmitted to the superordinate primary managing device. In a storage system such as ones described above, even when an abnormal condition occurs in the storage environment of the articles in the storage structure, the primary managing device cannot be made aware of this fact, making it difficult for the primary managing device to take effective actions or responses in terms of controlling quality of the articles.

To this end, a storage system is desired in which it is easier for the primary managing device to manage the article holders based on the storage environment of the articles.

A storage system comprises:
a storage structure having a plurality of storage sections for storing article holders for transporting articles and a carry-in-and-out portion for carrying in and carrying out the article holders;
one or more environment adjusters for adjusting storage environment of the articles held by the article holders in the storage sections, with the adjusting performed individually for each of the storage sections;
an environment managing portion for collecting information about the storage environment of the articles in each of the plurality of storage sections, and for controlling operation of the one or more environment adjusters;
a storage transport device for performing a carry out transport operation in which the article holder is transported from the storage section to the carry-in-and-out portion, and a carry in transport operation in which the article holder is transported from the carry-in-and-out portion to the storage section;
a primary managing device for outputting a carry out request for carrying out the article holder specified by identifying information provided to each of the article holders from the storage structure, and a carry in request for carrying in the article holder specified by the identifying information to the storage structure;
a carry-in-and-out managing device for managing locations of the storage sections in which the article holders are stored, by associating the locations of the storage sections in which the article holders are stored with the identifying information of the respective article holders, and for controlling the carry out transport operation or the carry in transport operation of the storage transport device based on the carry out request or the carry in request;
wherein the environment managing portion is configured to generate environment management information indicating storage environment of the articles for each of the storage sections, and to output the environment management information to the carry-in-and-out managing device, and wherein the carry-in-and-out managing device is configured to generate superordinate environment management information in which the environment management information for each of the storage sections outputted by the environment managing portion is associated with the identifying information of the article holder stored in corresponding one of the storage sections, and is configured to output the superordinate environment management information to the primary managing device.

With the arrangement described above, the carry-in-and-out managing device obtains the environment management information that indicates the storage environment of the articles for each storage section from the environment managing portion. Because the carry-in-and-out managing device manages the locations of the storage sections in which the article holders are stored by associating the locations of the storage sections in which the article holders are stored with the identifying information of the respective article holders, the carry-in-and-out managing device can generate superordinate environment management information about an article holder stored in a given storage section from the environment management information indicating the storage environment of the articles for each storage section by associating it with the identifying information of the article holder. And because the carry-in-and-out managing device outputs superordinate environment management information to the primary managing device, the primary managing device can obtain the superordinate environment management information about the article holders stored in the storage sections.

Therefore, when an abnormal condition occurs in an environment adjuster, for example, the primary managing device can respond properly, for example, by outputting a carry out request for retrieving, or carrying out, the article holder from the storage structure in order to move as promptly as possible the article holder stored in the storage section affected by the abnormal condition that occurred to another storage structure, or by restricting output of a carry in request to prevent an article holder from being carried into the storage structure until the abnormal condition of the environment adjuster is resolved. Thus, with the arrangement described above, a storage system is provided in which managing of article holders based on the storage environment of articles is facilitated for the primary managing device.

The technical features of the storage system in accordance with the present invention also apply to a storage method; and such method falls within the scope of protection of the present invention. And the functions and effects described above with respect to the storage system also apply to the storage method.

More particularly, a storage in accordance with the present invention is a method utilizing a storage system including a storage structure having a plurality of storage sections for storing article holders for transporting articles and a carry-in-and-out portion for carrying in and carrying out the article holders, one or more environment adjusters for adjusting storage environment of the articles held by the article holders in the storage sections, with the adjusting performed individually for each of the storage sections, an environment managing portion for collecting information about the storage environment of the articles in each of the plurality of storage sections, and for controlling operation of the one or more environment adjusters, a storage transport device for performing a carry out transport operation in which the article holder is transported from the storage section to the carry-in-and-out portion, and a carry in transport operation in which the article holder is transported from the carry-in-and-out portion to the storage section, a primary managing device for outputting a carry out request for carrying out the article holder specified by identifying information provided to each of the article holders from the storage structure, and a carry in request for carrying in the article holder specified by the identifying information to the storage structure, and a carry-in-and-out managing device for managing locations of the storage sections in which the article holders are stored, by associating the locations of the storage sections in which the article holders are stored with the identifying information of the respective article holders, and for controlling the carry out transport operation or the carry in transport operation of the storage transport device based on the carry out request or the carry in request wherein the environment managing portion is configured to generate environment management information indicating storage environment of the articles for each of the storage sections, and to output the environment management information to the carry-in-and-out managing device. And the storage method comprises the following step that is performed by the carry-in-and-out managing device:

an information output step of generating superordinate environment management information in which the environment management information for each of the storage sections outputted by the environment managing portion is associated with the identifying information of the article holder stored in corresponding one of the storage sections, and outputting the superordinate environment management information to the primary managing device.

Examples of preferred embodiments of the present invention are described next.

In an embodiment of the storage system in accordance with the present invention, the carry-in-and-out managing device is also preferably configured to generate transport management information which is information about the carry in transport operation and the carry out transport operation, and to output the transport management information to the primary managing device, wherein a plurality of distinct transport management information is preferably provided as the transport management information, wherein a plurality of distinct superordinate environment management information is preferably provided as the superordinate environment management information, and wherein the carry-in-and-out managing device preferably outputs the transport management information and the superordinate environment management information to the primary managing device with an information identifier that can be used to identify the transport management information and the superordinate environment management information.

With the arrangement described above, because the primary managing device can obtain any one of a plurality of superordinate environment management information, the primary managing device can obtain information about the event that has occurred in the storage environment of the articles with the events classified into a plurality of distinct events. This facilitates for the primary managing device to manage article holders based on specific storage environment of the articles.

And since the primary managing device can identify the transport management information among distinct transport management information, and the superordinate environment management information among distinct superordinate environment management information by an information identifier, the superordinate environment management information can be communicated to the primary managing device using the same communication method and protocol as the communication method and protocol for communicating the transport management information with the carry-in-and-out managing device. Therefore, an arrangement, which allows the primary managing device to obtain the superordinate environment management information from the carry-in-and-out managing device, can be provided without complicating the communication environment, for example, by having to use a separate communication method.

In an embodiment of the storage system in accordance with the present invention, the environment management information is preferably information that indicates which one of a plurality of kinds of states defined in advance the storage environment of the articles has come to be in.

With the arrangement described above, when the storage environment of articles in the storage structure has become one of the states defined in advance, the primary managing device can recognize and identify the event based on the environment management information. This arrangement makes it possible to take proper measure depending on the event that occurred during the carrying out and the carrying in of an article holder stored in the storage structure.

In an embodiment of the storage system in accordance with the present invention, the environment management information preferably includes information that indicates that an abnormal condition occurred in at least one of the one or more environment adjusters.

With the arrangement described above, when an abnormal condition occurs in an environment adjuster and thus a problem has occurred in the storage environment of the articles in the storage structure, the primary managing device can recognize this event based on the environment management information. This allows the primary managing device to output a carry out request for retrieving, or carrying out, the article holder from the storage structure in order to move as promptly as possible the article holder stored in the storage section affected by the abnormal condition that occurred to another storage structure, or to restrict output of a carry in request to prevent an article holder from being stored in the storage structure until the abnormal condition of the environment adjuster is resolved.

In an embodiment of the storage system in accordance with the present invention, each of the article holders is preferably an airtight container which can store articles which should be stored in an inactive gas atmosphere, wherein each of the one or more environment adjusters preferably has an inactive gas supplying device which supplies inactive gas to the container stored in the storage section, wherein the environment management information preferably includes information indicating that supplying of inactive gas to the container by the inactive gas supplying device is started or information that the supplying of the inactive gas to the container is completed.

With the arrangement described above, by storing containers, each of which can store the articles which should be stored in an inactive gaseous atmosphere, in the storage sections, inactive gas can be supplied to each container by the inactive gas supplying device. And because the primary managing device can receive, as environment management information, information indicating that the supplying of inactive gas to the container is started or information that the supplying of the inactive gas to the container is completed, the primary managing device can identify any container for which the supplying of inactive gas has been started but has not yet been completed. Thus, by operating to reduce, to the extent possible, the number of outputting carry out requests for the containers for which the supplying of inactive gas has not been completed, incidents of retrieving or carrying out containers, that have not received sufficient supply of inactive gas from the storage structure, can be reduced to the extent possible. Therefore, a storage system is provided which is advantageous in terms of quality maintenance of the articles which should be stored in an inactive gas atmosphere.

In an embodiment of the storage method in accordance with the present invention, the information output step further includes generating transport management information which is information about the carry in transport operation and the carry out transport operation, and outputting the transport management information to the primary managing device, wherein a plurality of distinct transport management information is preferably provided as the transport management information, wherein a plurality of distinct superordinate environment management information is preferably provided as the superordinate environment management information, wherein in the information output step, the transport management information and the superordinate environment management information are preferably outputted to the primary managing device with an information identifier that can be used to identify the transport management information and the superordinate environment management information.

In an embodiment of the storage method in accordance with the present invention, the environment management information is preferably information that indicates which one of a plurality of kinds of states defined in advance the storage environment of the articles has come to be in.

In an embodiment of the storage method in accordance with the present invention, the environment management information preferably includes information that indicates that an abnormal condition occurred in at least one of the one or more environment adjusters.

In an embodiment of the storage method in accordance with the present invention, each of the article holders is preferably an airtight container for storing articles which should be stored in an inactive gas atmosphere, wherein each of the one or more environment adjusters preferably has an inactive gas supplying device which supplies inactive gas to the container stored in the storage section, and wherein the environment management information preferably includes information indicating that supplying of inactive gas to the container by the inactive gas supplying device is started or information that the supplying of the inactive gas to the container is completed.

BRIEF DESCRIPTION OF THE DRAWINGS

FIG. 3 shows an example of management information,
FIG. 4 schematically shows purge patterns for supplying nitrogen gas,
FIG. 5 shows an example of communication that takes place when a container is carried in,
FIG. 6 shows the example of communication that takes place when a container is carried in.

DETAILED DESCRIPTION

Figure 1:
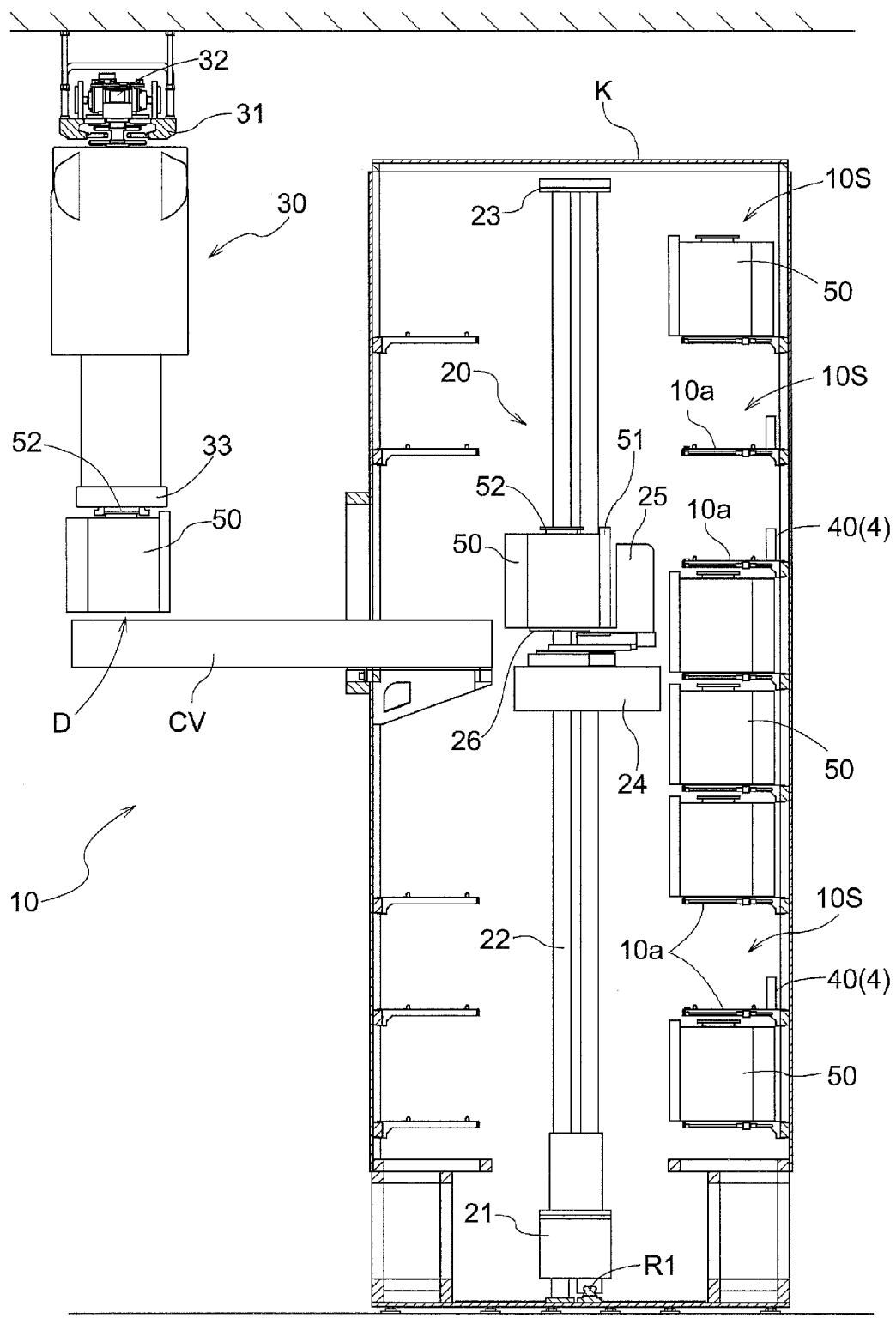
FIG. 1 is a vertical sectional front view of a storage structure.

An embodiment of a storage system and storage method in accordance with the present invention is described next with reference to the drawings. As shown in FIG. 1, a storage structure 10 is installed on the floor of a clean room in which downflow of clean air is generated. The storage structure 10 has a plurality of storage sections 10S that are arranged in columns with one located above another in the vertical direction and in rows with one located next to another in the lateral direction (or, the horizontal direction), and also has a carry-in-and-out portion for carrying in and carrying out containers 50 to or from the storage structure 10. Each storage section 10S is configured to store a substrate carrying container 50 for storing, or holding, semiconductor substrates, which should be stored in an inactive gaseous atmosphere, in an air-tight environment. The container 50 is the article holder of the present invention. The periphery of the storage structure 10 is defined and covered by walls K. And a carry-in-and-out conveyor CV is provided such that it extends through a wall K. A stacker crane 20 is provided in installation space (interior of the storage structure 10). The outside end of the carry-in-and-out conveyor CV is defined to be a carry-in-and-out portion D.

After being transported from outside of the wall K toward the inside of the wall K by the carry-in-and-out conveyor CV, the container 50 placed on the carry-in-and-out portion D is picked up, at the inside end of the carry-in-and-out conveyor CV, by a transfer device 25 provided to the stacker crane 20. And the container 50 is carried into, or stored in, a storage section 10S through traveling operation of the stacker crane 20 and its vertical movement operation as well as transfer operation of the transfer device 25. Also, the container 50 stored in a storage section 10S is taken out, or retrieved, from the storage section 10S by the stacker crane 20. And after being unloaded onto the inside end of the carry-in-and-out conveyor CV, the container 50 is transported from inside the wall K toward outside the wall K and to the outside end of the carry-in-and-out conveyor CV by the carry-in-and-out conveyor CV and is thus retrieved, or carried out, from the storage structure 10. In other words, in the present embodiment, the stacker crane 20 and the carry-in-and-out conveyor CV together define the storage transport device that performs a carry out transport operation in which a container 50 (article holder) is transported from a storage section 10S to the carry-in-and-out portion D, and a carry in transport operation in which a container 50 (article holder) is transported from the carry-in-and-out portion D to a storage section 10S.

In addition, in the present embodiment, one conveyor is provided, as the carry-in-and-out conveyor CV, for both carrying in and carrying out a container 50 so that there is one location for the carry-in-and-out portion. However, two separate conveyors, one for carrying in, and the other for carrying out, may be provided to define a carry-in-and-out portion by the carry in portion defined at the outside end of one conveyor and the carry out portion defined at the outside end of the other conveyor. In addition, instead of providing the carry-in-and-out conveyor CV, a receiving platform may be provided inside the storage structure 10, and this receiving platform may function as the carry-in-and-out portion D. In this case, the ceiling transport vehicle 30 is provided with a horizontal displacement mechanism which horizontally moves the hoist portion 33. Furthermore, the carry-in-and-out portion D is not limited to one which the ceiling transport vehicle 30 delivers a container 50 to and receives a container 50 from (i.e., transfer a container 50 to or from). For example, it may be a location which a worker may deliver and receive the container 50 to and from, such as a receiving platform provided inside the storage structure 10 and on the floor at a predetermined height which corresponds to a worker's height.

In the storage system of the present embodiment, the container 50 is carried in to, and out from, the storage structure 10 by a plurality of overhead or ceiling transport vehicles 30 which function as external transport devices. The ceiling transport vehicle 30 has a vehicle body 32 which is suspended and supported by guide rails 31 attached to the ceiling of the clean room and which is capable of traveling along the guide rails, and a hoist portion 33 which can be vertically moved, or raised and lowered, directly below this vehicle body 32 and which is capable of gripping a top flange 52 of the container 50. Thus, the ceiling transport vehicle 30 can deliver a container 50 to, and receive a container 50 from, the carry-in-and-out portion D of the storage structure 10.

The guide rails 31 for the ceiling transport vehicle 30 are installed along and by way of transfer stations for processing devices (not shown) which process the semiconductor substrates stored in the containers 50. The ceiling transport vehicle 30 delivers a container 50 to a transfer station and receives a container 50 from the transfer station by vertically moving the hoist portion 33 while the ceiling transport vehicle 30 is stopped directly above the transfer station. And each ceiling transport vehicle 30 transports containers 50, one at a time, among transfer stations of the plurality of processing devices, and between a transfer station and the carry-in-and-out portions D of the storage structure 10.

Each container 50 is an airtight container made of synthetic resin and in compliance with the SEMI (Semiconductor Equipment and Materials International) standard, is used to store semiconductor wafers (substrates), and is called a FOUP (Front Opening Unified Pod). And while detailed description is omitted, an opening for inserting and retrieving substrates, which is opened and closed by a lid 51 which can be detached and attached, is formed in the front face of the container 50 such that the interior space of the container 50 is sealed to create an airtight environment when the lid 51 is attached to close the opening. A top flange 52 configured to be gripped by the hoist portion 33 of the ceiling transport vehicle 30 is formed in the top surface of the container 50. Also, while not shown, each container 50 is provided with an ID tag, which functions as a container identifier which has mutually distinguishable identifying information.

In addition, while not shown, the container 50 has a gas supply opening and a discharge opening in its bottom portion to introduce nitrogen gas which functions as the inactive gas. Each of these openings has an opening and closing valve which is urged toward its closed position. And these valves are configured to be opened by the pressure of nitrogen gas as the nitrogen gas is supplied and injected through an inject nozzle provided to the receiving support portion 10a with the container 50 received and supported at the predetermined position on the receiving support portion 10a of the storage section 10S. Thus, air inside the container is discharged from the discharge opening of the container 50 as nitrogen gas is supplied to inside the container 50 through the gas supply opening, with a result that air inside the container 50 is replaced by the nitrogen gas.

The stacker crane 20 includes a travel carriage 21 capable of traveling along a travel rail R1 provided on the floor area on the front face side of the storage sections 10S, a mast 22 provided to stand vertically on the travel carriage 21, and a vertically movable platform 24 which can be vertically moved or raised and lowered while being guided by the mast 22. In addition, an upper frame 23 provided at the upper end of the mast 22 is configured to engage an upper guide rail (not shown) provided on the ceiling side of the installation space whose periphery is defined and covered by the walls K.

The vertically movable platform 24 is provided with a transfer device 25 for transferring a container 50 to or from a storage section 10S. The transfer device 25 has a plate-shaped support body 26 which receives and supports a container 50 such that the support body 26 can be projected and retracted between a projected position in which the support body 26 is projected to inside the storage section 10S and a retracted position in which the support body 26 is retracted toward the vertically movable platform 24. The stacker crane 20 having the transfer device 25 is configured to perform an unloading operation in which the container 50 placed on the support body 26 is unloaded onto a storage section 10S, and a pick up operation in which the container 50 stored in a storage section 10S is picked up or taken out therefrom, by conducting projecting and retracting operation of the support body 26, and vertical movement operation of the vertically movable platform 24.

An ID reader 27 (see FIG. 2), which functions as a container identifying information reading portion which reads an ID tag provided to each container 50, is provided in the distal end portion of the support body 26 of the transfer device 25. Similarly, an ID reader 27 which reads ID tags of the containers 50 is provided also at the outside end portion (carry-in-and-out portion D) of the carry-in-and-out conveyor CV and at its inside end portion (see FIG. 2).

The stacker crane 20 is equipped with a travel position detector which detects the travel position on the travel path, and a vertical position detector which detects the vertical position of the vertically movable platform 24. And a stocker controller H2 which controls operation of the stacker crane 20 is configured to control operation of the stacker crane 20 based on detected information from the travel position detector and the vertical position detector.

Each of the plurality of storage sections 10S includes a plate-shaped receiving support portion 10a which receives and supports a container 50. Each receiving support portion 10a is provided with two load presence sensors 10z which detect whether a container 50 is stored in the storage section 10S by detecting the container 50 when the container 50 is placed on the receiving support portion 10a. The detected information from the load presence sensors 10z is inputted to a purge controller H1 which controls operations of mass flow controllers 40 through a programmable logic controller P (see FIG. 2).

The receiving support portion 10a has an inject nozzle through which nitrogen gas, which functions as inactive gas, is supplied to inside the container 50, and a discharging gas passage body which allows gas to be discharged from inside the container 50 to pass through. As shown in FIG. 1, a mass flow controller 40, which controls supply of nitrogen gas, is provided at a location toward the back end (i.e., closer to an end which is opposite from the opening through which the container 50 is inserted and retracted) of the storage section 10S and near an end portion of the container 50 in the rack lateral (right and left) direction.

The mass flow controller 40 is provided for each of the storage sections 10S. And the purge controller H1 issues a flow rate command to the mass flow controller 40 with a container 50 received and supported by the receiving support portion 10a, to cause the mass flow controller 40 to cause the nitrogen gas to be injected through the inject nozzle at a pressure higher than the atmospheric pressure by a preset value or more. Thus, nitrogen gas can be injected into inside the container 50 from the gas supply opening of the container 50 whereas the gas in the container is discharged to outside from the discharge opening of the container 50. In addition, a control valve V of a type that is opened and closed electromagnetically is provided on the upstream side of the mass flow controller 40. The control valve V is electrically connected to the purge controller H1 through the programmable logic controller P. And the purge controller H1 is configured to control the opening and closing of the control valve V.

The mass flow controller 40 includes a introducing side port and a discharging side port. The supply pipe mentioned above is connected to the discharging side port whereas a supply pipe, which branches off from a primary supply pipe connected to the nitrogen gas supply source to direct nitrogen gas, is connected to the introducing side port. The mass flow controller 40 includes a flow rate adjusting valve which changes and adjusts the flow rate of the nitrogen gas which flows through the internal passage which extends from the introducing side port to or toward the discharging side port, a flow rate sensor which measures the flow rate of the nitrogen gas which flows through the internal passage, and an internal control unit which controls the operation of the flow rate adjusting valve.

In addition, the internal control unit of the mass flow controller 40 has self-diagnosis function for determining whether the internal control unit itself is malfunctioning. The nitrogen gas supply source is equipped with a governor etc., which adjusts the supply pressure of nitrogen gas to a set pressure which is higher than the atmospheric pressure by a preset value or more.

Thus, in the present embodiment, an inactive gas supplying device 4 for any given storage section 10S is defined and formed by the mass flow controller 40 which is its primary component, the inject nozzle, the control valve V, and the supply pipes etc. that connect these components. And the inactive gas supplying device 4 for each of the plurality of storage sections 10S is, or functions as, an environment adjuster F. In addition, the inactive gas supplying device 4 is not provided to some of the storage sections 10S of the storage structure or rack 10. And those storage sections 10S are non-purging shelves solely for storing the containers 50 by means of the receiving support portions 10a.

Figure 2:
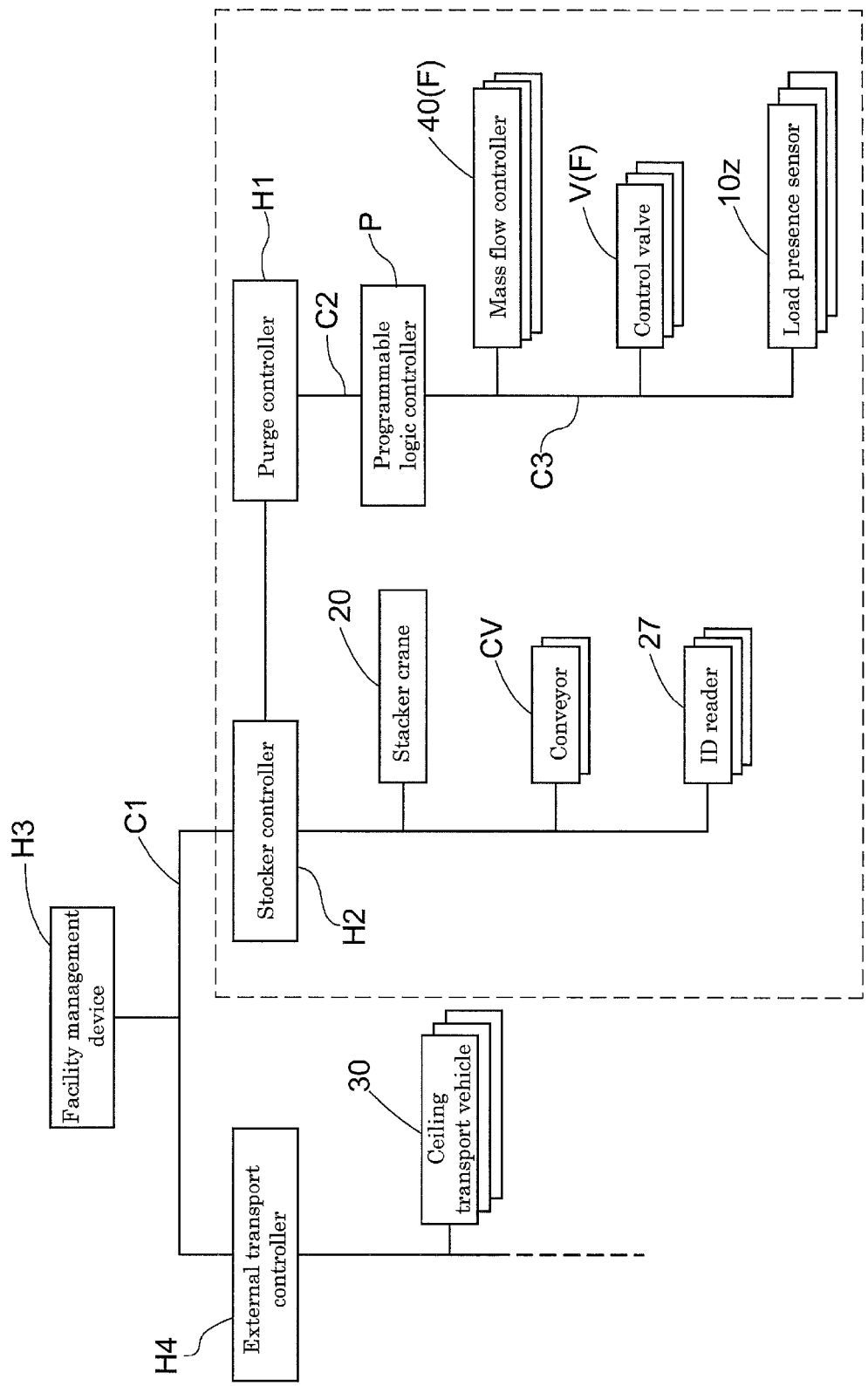
FIG. 2 is a block diagram showing communication paths.

As shown in FIG. 2, the storage system of the present embodiment includes the purge controller H1 which outputs flow rate commands to the mass flow controllers 40, a stocker controller H2 which controls carry out transport operations and carry in transport operations of the stacker crane 20, and a facility management device H3 which outputs a carry out request for retrieving a container 50 from the storage structure 10 and a carry in request for carrying in, or storing, a container 50 to the storage structure 10.

The purge controller H1 collects information about the storage environment of the semiconductor substrates in each of the plurality of storage sections 10S, and controls the operations of the environment adjusters F. Therefore, the purge controller H1 functions as the environment managing portion of the present invention. In addition, the information about the storage environment includes, for example, information about the open or closed state of the control valve V, information on the operating state of the mass flow controller 40 (i.e., supply pressure of nitrogen gas, supply flow rate, supply period, etc.).

The stocker controller H2: manages, or keeps track of, the locations of the storage sections 10S in which the containers 50 are stored by means of the inventory management data which includes the locations of the storage sections 10S in which containers 50 are stored such that the location of each of such storage sections 10S is associated with the identifying information of the container 50 stored in that storage section 10S; and controls a carry out transport operation or a carry in transport operations of the stacker crane 20 based on a carry out request or a carry in request. Therefore, the stocker controller H2 functions as a carry-in-and-out managing device of the present invention.

The facility management device H3 outputs a carry out request for carrying out, or retrieving, a container 50 specified by the identifying information provided to each container 50, from the storage structure 10, and a carry in request for carrying in, or storing, a container 50 specified by the identifying information, into the storage structure 10. Therefore, the facility management device H3 functions as the primary managing device of the present invention.

The purge controller H1, the stocker controller H2, and the facility management device H3 are computers which can process information, for example using stored programs, and are connected to each other by a network C1 which is a LAN utilizing the TCP/IP protocol. In addition, the programmable logic controller P is connected to the purge controller H1 through a network C2 for mutual communication utilizing a standard such as the RS-232C, etc. Each mass flow controller 40, each control valve V, and each load presence sensor 10z are connected to the programmable logic controller P through a control bus C3.

The external transport controller H4 is also connected to the network C1 so that the facility management device H3 can communicate also with the external transport controller H4. The facility management device H3 transmits transport request information which includes transport origin information and transport destination information for the container 50 to be transported to the external transport controller H4. The external transport controller H4 controls the operation of the ceiling transport vehicle 30 based on the received transport request, and transmits progress information on the transport operation related to the transport request to the facility management device H3.

The purge controller H1 commands, or transmits to, the programmable logic controller P, a target flow rate for the mass flow controller 40 provided for each of the plurality of storage sections 10S. When the programmable logic controller P receives identifying information of a mass flow controller 40 and a command for the target flow rate for the mass flow controller 40 from the purge controller H1, the programmable logic controller P is configured to output the command for the target flow rate to the mass flow controller 40 that corresponds to the identifying information.

The target flow rates which the purge controller H1 outputs include a target flow rate for storage, a target flow rate for nozzle cleaning, and a target flow rate for cleaning. The target flow rate for storage is a target flow rate commanded to the mass flow controller 40 in order to introduce nitrogen gas into inside a container 50 when the container 50 is stored in the storage section 10S. The target flow rate for nozzle cleaning is a target flow rate commanded in order to clean the inject nozzle immediately before the container 50 is stored into the storage section 10S. The target flow rate for cleaning is a target flow rate commanded in order to clean the nitrogen gas supply passage such as the inject nozzle and the supply pipes when installing the storage structure 10, etc.

Figure 4:
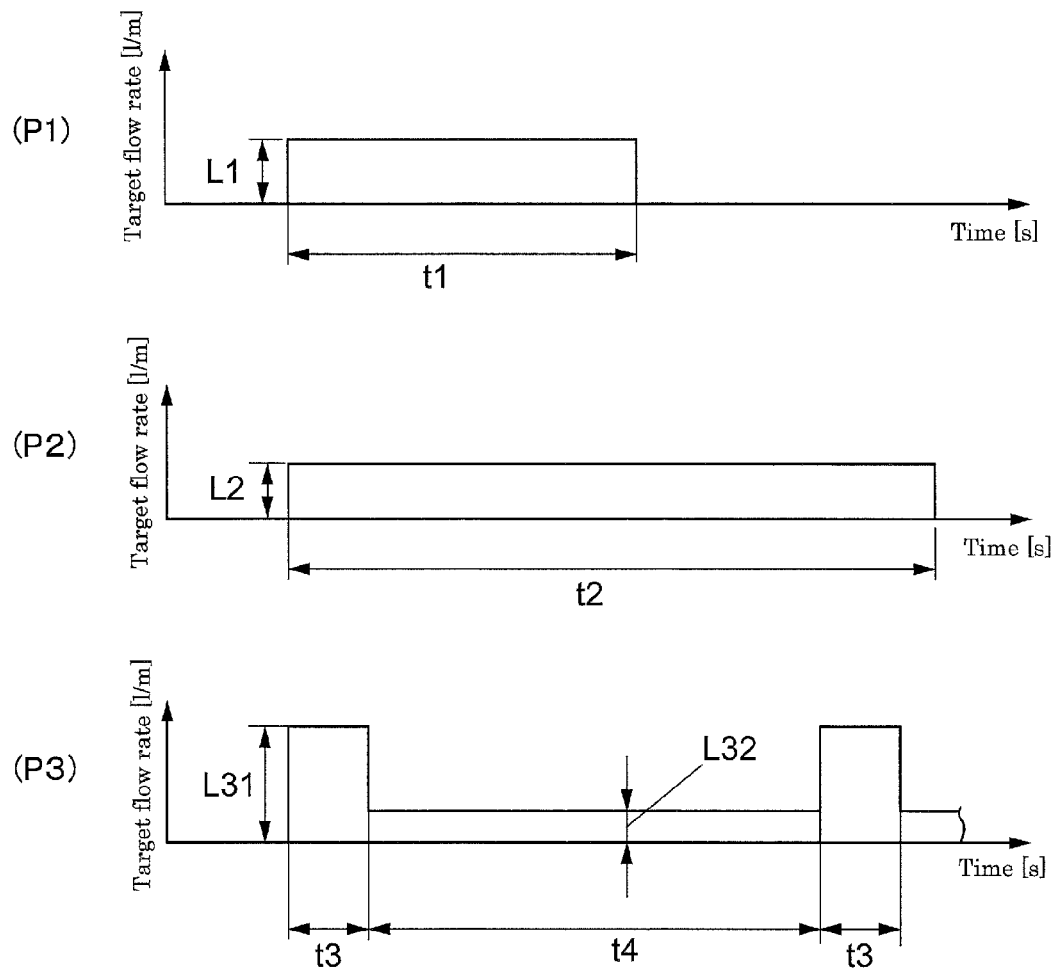

As shown in FIG. 4, the purge controller H1 stores, in its memory, a nozzle purge pattern P1, a cleaning pattern P2, and a storage purge pattern P3 as a plurality of purge patterns which define, or specify, target flow rates and supply periods.

And when a cleaning start command is issued by means of a control panel (not shown) at the time of installation of the storage structure 10, etc., the purge controller H1 outputs a flow rate command for controlling the operation of the mass flow controller 40 to the programmable logic controller P to set the supply mode of nitrogen gas to be a supply mode for cleaning. The supply mode for cleaning is a mode in which the inactive gas supplying device 4 is cleaned in accordance with the cleaning pattern P2 where the target flow rate is set to be a cleaning flow rate for cleaning and the supply period is set to be a time period for cleaning.

When a container 50 is carried into the carry-in-and-out conveyor CV, the purge controller H1 outputs a flow rate command, for the mass flow controller 40 for the storage section 10S in which the container 50 is to be stored, to the programmable logic controller P to cause the nitrogen gas to be supplied at target flow rate for nozzle cleaning in accordance with the nozzle purge pattern P1. In addition, in the present embodiment, the fact that a container 50 has been carried in to the carry-in-and-out portion D (carry-in-and-out conveyor CV) is determined based on the transmission of transfer completion information by the external transport controller H4 to the facility management device H3 and the stocker controller H2, as progress information for the transport operation. And the result of this determination is transmitted to the purge controller H1.

The purge controller H1 is configured to output a target flow rate for storage to the programmable logic controller P based on the storage purge pattern P3 when the two load presence sensors 10z detect a container 50.

The nozzle purge pattern P1 is defined to be a pattern for supplying nitrogen gas, at a target flow rate L1 (for example, 30 liters/minute) defined as a target flow rate for nozzle cleaning for a supply period t1 (for example, 5 seconds) defined as a pre-storage supply period, to the storage section 10S that has been selected, or specified, as the storage location for the container 50 placed on the carry-in-and-out portion D of the carry-in-and-out conveyor CV.

The cleaning pattern P2 is defined as a pattern for supplying nitrogen gas at a target flow rate L2 (for example, 20 liters/minute) defined as the target flow rate for cleaning for a supply period t2 (for example, 1800 seconds) defined as an installation initial supply period from the time a worker issues a cleaning start command by means of the control panel.

In the storage purge pattern P3, initial target flow rate L31 (for example, 50 liters/minute) and steady-state target flow rate L32 (for example, 5 liters/minute) which is less than the initial target flow rate are defined as the target flow rate for storage. The storage purge pattern P3 is a pattern in which, when supplying nitrogen gas to a container 50, nitrogen gas is supplied at the target flow rate value for storage, which is first set at the initial target flow rate L31 of relatively large flow rate for a set initial period t3 (for example, 5 seconds), and which is subsequently changed to a steady-state target flow rate L32 of relatively small flow rate. By conducting purging at the initial target flow rate L31 of relatively large flow rate in an early stage of purging, it is possible to replace the air inside the container 50 with nitrogen gas as soon after the container 50 is stored in the storage section 10S as possible. In addition, after the supplying of nitrogen gas at the steady-state target flow rate L32 is continued for a set duration t4 (for example, 300 seconds), the nitrogen gas is supplied again at the initial target flow rate L31 for the set initial period t3. Incidentally, a worker defines and store in advance, using the control panel, a plurality of purge patterns (including the value and the duration of each of the initial target flow rate L31 and the steady-state target flow rate L32). And a pattern selected from these stored patters is registered or specified as the storage purge pattern P3.

The purge controller H1 generates environment management information which indicates the storage environment of the semiconductor substrates in each storage section 10S, and outputs the information to the stocker controller H2. The examples of environment management information are information indicating that the purging of the nitrogen gas at the initial target flow rate L31 as specified by the storage purge pattern P3 has been started, information indicating that the purging of the nitrogen gas at the initial target flow rate L31 as specified by the storage purge pattern P3 has been completed, information indicating that, for some reason such as failure of the mass flow controller 40 etc., there is one or more storage sections 10S that cannot perform the purging with nitrogen gas, among the storage sections 10S provided with the inactive gas supplying device 4, and information indicating that the purging with nitrogen gas in accordance with the storage purge pattern P3 was interrupted, among other information. The purging with nitrogen gas at the initial target flow rate L31 as specified by the storage purge pattern P3 is started when a container 50 is stored in the storage section 10S.

The stocker controller H2 generates, as transport management information, progress information for each of the carry in transport operation and the carry out transport operation of containers 50 in the storage structure 10, and outputs the progress information to the facility management device H3. In addition, the stocker controller H2 generates superordinate environment management information in which environment management information for each of the storage sections 10S outputted by the purge controller H1 is associated with the identifying information of the container 50 stored in the corresponding one of the storage sections 10S, and outputs the superordinate environment management information to the facility management device H3. The step in which the stocker controller H2 outputs information to the facility management device H3 is the "information output step" in the present invention.

An example of the transport management information and superordinate environment management information which the stocker controller H2 in the present embodiment generates and outputs is shown in the table of FIG. 3. From "Stacker crane start up" having identification number 01 through "Container take out completed" having identification number 09 are transport management information. And among "Purging discontinued" having identification number 11 through "Purging status changed" having identification number 14, "Purging discontinued" having identification number 11, "Purging started" having identification number 12, and "Purging completed" having identification number 13 are superordinate environment management information in which the environment management information of a storage section 10S having the inactive gas supplying device 4 (hereinafter referred to as a "purge shelf 10S") is associated with the identifying information of the container 50 stored in that purge shelf 10S. "Purging status changed" having identification number 14 is the environment management information outputted when a purge shelf 10S, among the purge shelves 10S in the storage structure 10, becomes ineffective, and is not generated in association with a specific container 50, but is superordinate environment management information about the whole of the storage rack or structure 10.

As indicated by FIG. 3, a plurality of distinct information, which can be identified by information identifiers having the same format, is provided as transport management information and as superordinate environment management information. The stocker controller H2 outputs, to the primary managing device, transport management information and superordinate environment management information together with the identification number shown in FIG. 3 as an information identifier which can be used to identify the transport management information among distinct transport management information as well as the superordinate environment management information among distinct superordinate environment management information. The identification number and the description (with the description expressed as text data) of the management information corresponding to the identification number are added to the transport management information and the superordinate environment management information that the stocker controller H2 outputs; however, since the management information can be uniquely specified by either one of the identification number and the text data, one of the text data representing the description of the management information and the identification number data may be omitted. In addition, when outputting superordinate environment management information, the stocker controller H2 outputs the superordinate environment management information together with a list of associated containers which consists of identifying information that specifies the containers 50 associated with the superordinate environment management information (the list may have only one such container 50). Similarly, when outputting transport management information having any one of identification numbers 05-09, the stocker controller H2 outputs, to the facility management device H3, the transport management information together with the identifying information which specifies the containers 50 associated with the transport management information.

Among the superordinate environment management information, "Purging discontinued" having identification number 11 is outputted when the purge controller H1 determines that an abnormal condition occurred in the purge state of the storage section 10S, for example, when an abnormal condition of the inactive gas supplying device 4 for the storage section 10S in which a container 50 has been purged with nitrogen in accordance with the purge pattern P3 is notified from the mass flow controller 40 by the self-diagnosis function of the mass flow controller 40, etc. In other words, the environment management information includes information indicating that an abnormal condition occurred in the environment adjuster F (inactive gas supplying device 4).

"Purging status changed" having identification number 14 is outputted by the stocker controller H2 when a storage section 10S exists among the purge shelves 10S in which the nitrogen purging has become impossible due, for example, to a failure of the inactive gas supplying device 4.

"Purging started" having identification number 12 is information indicating that the purging with nitrogen gas at the initial target flow rate L31 defined in the storage purge pattern P3 is started. "Purging completed" having identification number 13 is information indicating that the purging with nitrogen gas at the initial target flow rate L31 defined in the storage purge pattern P3 is completed. In other words, in the present embodiment, the environment management information includes information indicating that supplying of the inactive gas into the container 50 by the inactive gas supplying device 4 is started or information indicating that the supplying of the inactive gas into the container 50 is completed. The purging with nitrogen gas at the initial target flow rate L31 defined in the storage purge pattern P3 is started when the container 50 is stored in a purge shelf 10S.

Thus, in the present embodiment, there are "Purging discontinued" having identification number 11, "Purging started" having identification number 12, and "Purging completed" having identification number 13, as environment management information. These pieces of information provide an indication as to which of the plurality of kinds of states the storage environment of semiconductor substrates has come to be in.

Next, reference is made to FIGS. 5 to 8 to describe communication process among the purge controller H1, the stocker controller H2, and the facility management device H3 based on an example in which a container 50 is carried into a purge shelf 10S of the storage structure 10, and an example in which an abnormal condition occurs in the purge shelf 10S.

Figure 5:
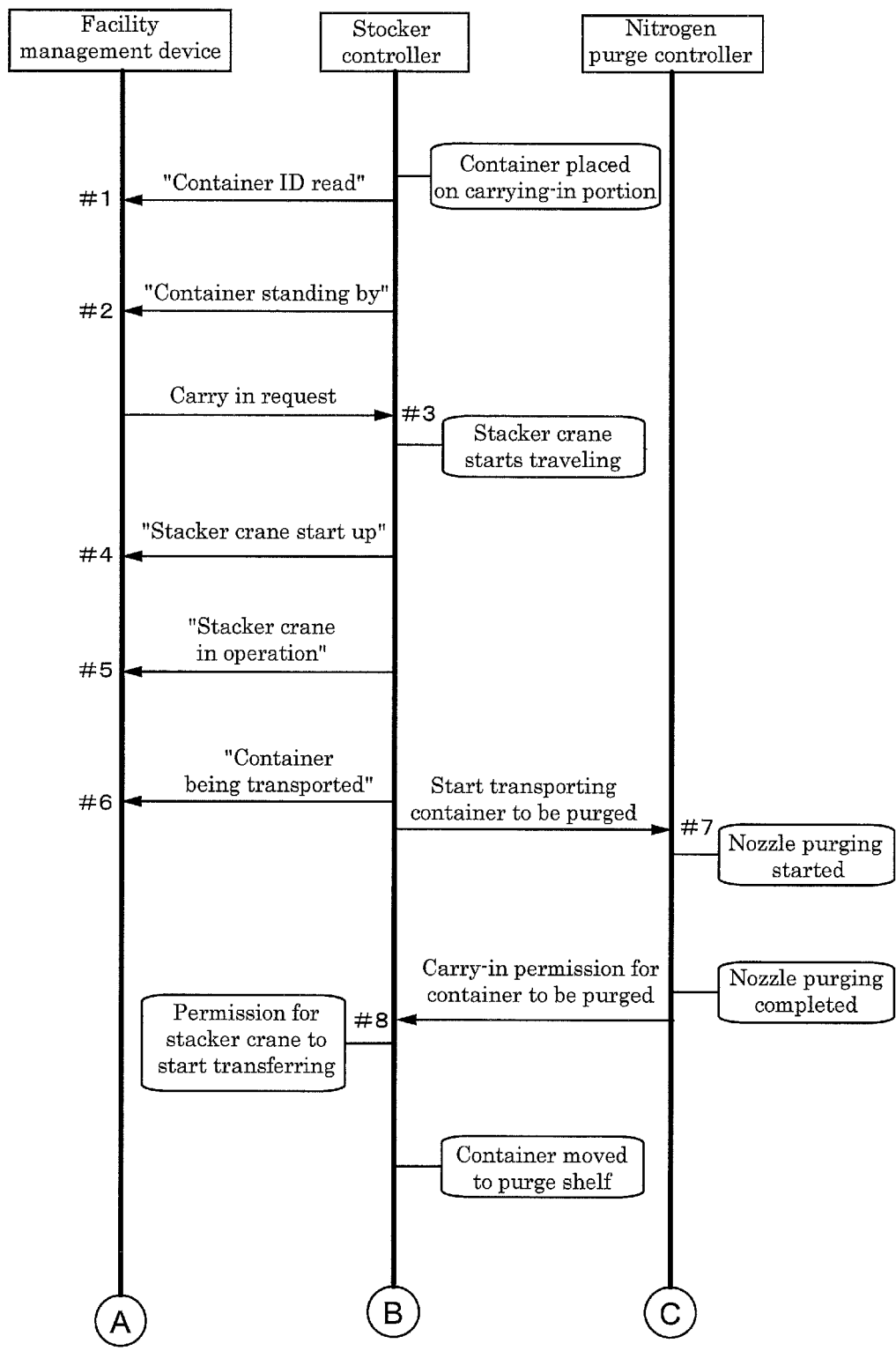
Figure 6:
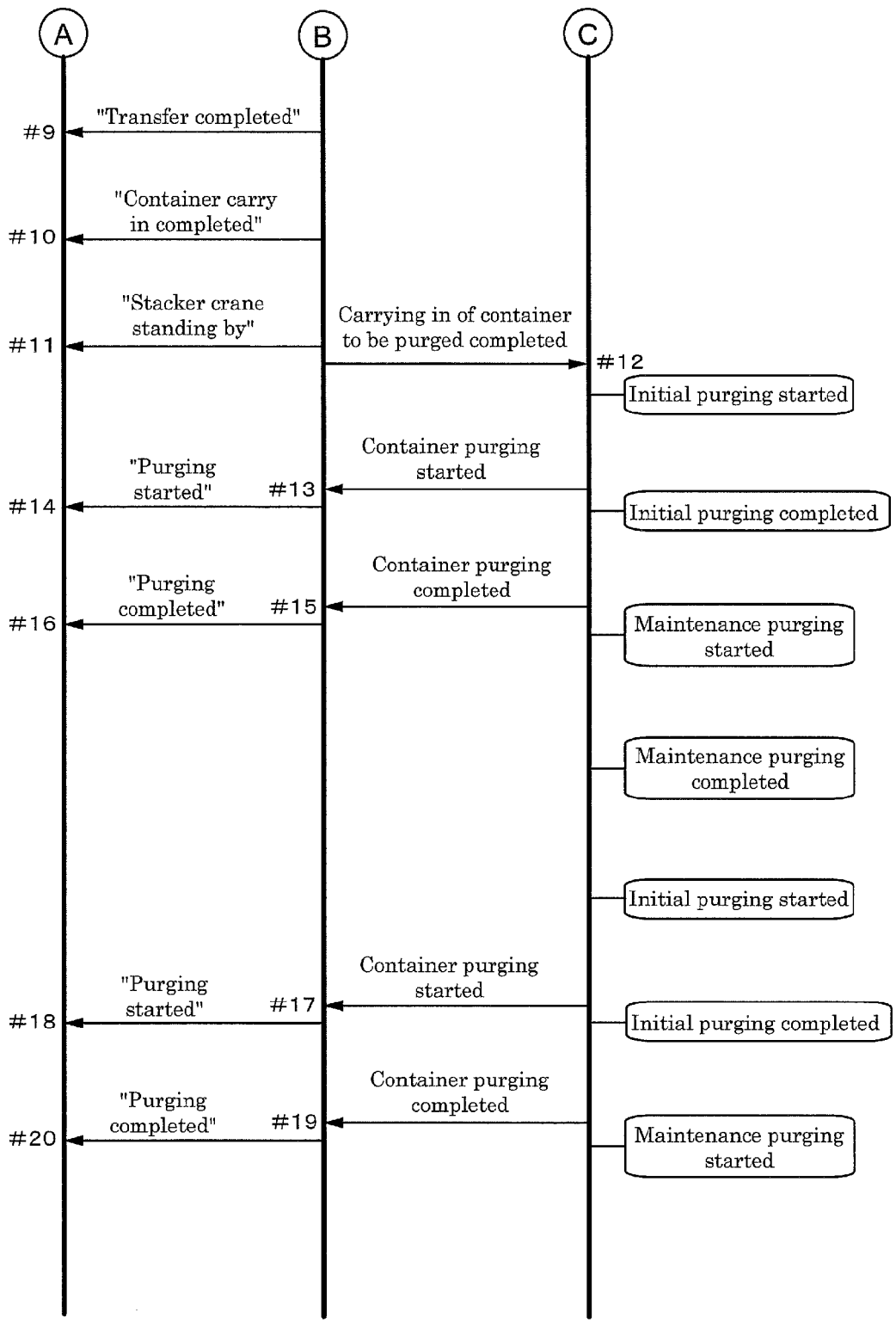

First, communication is described in the case where a container 50 is carried into a purge shelf 10S of the storage structure 10 with reference to FIGS. 5 and 6. When a container 50 is placed on the carrying-in portion (the carry-in-and-out portion D in the present embodiment) by the ceiling transport vehicle 30, the identifying information of the container 50 recorded on the ID tag of the container 50 that has been carried in is read by the ID reader 27 in the carry-in-and-out portion D. The stocker controller H2 then associates management information, "Container ID read" having identification number 05, with the identifying information of the container 50 and transmits it to the facility management device H3 (#1). The stocker controller H2 does not perform the carry in transport operation until there is a carry in request from the facility management device H3 and associates the management information, "Container standing by" having identification number 06, with the identifying information of the container and transmits it to the facility management device H3 (#2).

When a carry-in request is transmitted from the facility management device H3 (#3), the stocker controller H2 selects an empty purge shelf 10S to which the container 50 is to be carried in based on the carry-in request, and controls operations of the carry-in-and-out conveyor CV and the stacker crane 20 to cause a carry in transport operation to be performed to cause the container 50 to be transported from the carry-in-and-out portion D to the selected purge shelf 10S. When this happens, the stocker controller H2 sequentially transmits to the facility management device H3 transport management information, "Stacker crane start up" having identification number 01, "Stacker crane in operation" having identification number 02, "Container being transported" having identification number 07 (#4-#6). Further, the stocker controller H2 transmits to the purge controller H1 that movement of the container 50 to be purged, toward the purge shelf 10S into which the container 50 is to be carried is started (#7). Upon receiving this transmission, the purge controller H1 controls the operation of the inactive gas supplying device 4 of the purge shelf 10S to start the nitrogen purging in accordance with the nozzle purge pattern P1.

When the nitrogen purging in accordance with the nozzle purge pattern P1 is completed, the purge controller H1 issues to the stocker controller H2 a permission for the container 50 to be purged to be carried in (#8). In the event that the container 50 is transported to a location in front of the purge shelf 10S before the carry-in permission is issued, the stocker controller H2 does not start the unloading operation of the container 50 by the transfer device 25 and waits for the carry-in permission. The stocker controller H2 permits the stacker crane 20 to start the transfer operation based on the carry-in permission from the purge controller H1 and causes an unloading operation by the transfer device 25 to proceed. This allows the container 50 to be carried into the purge shelf 10S to which the container 50 is to be carried in. When the transferring of the container 50 is completed, the stocker controller H2 sequentially transmits, to the facility management device H3, transport management information, "Transfer completed" having identification number 03, "Container carry in completed" having identification number 08, and "Stacker crane standing by" having identification number 04 (#9-#11). Further, the stocker controller H2 transmits to the purge controller H1 that the carrying in of the container 50 to be purged has been completed (#12).

The purge controller H1 causes the nitrogen purging to be started (initial purging) at the initial target flow rate L31 defined in the storage purge pattern P3 when the information that the carrying in of the container 50 has been completed is received from the stocker controller H2, and transmits information to this effect to the stocker controller H2 (#13). When the stocker controller H2 receives the information from the purge controller H1 that the nitrogen purging in accordance with the storage purge pattern P3 has been started, the stocker controller H2 selects the identifying information of the container 50 stored in the purge shelf 10S from the inventory management data, and associates superordinate environment management information, "Purging started" having identification number 12, with the identifying information of the container 50, and transmits it to the facility management device H3 (#14).

When the nitrogen purging at the initial target flow rate L31 of the storage purge pattern P3 is completed, the purge controller H1 transmits information to this effect to the stocker controller H2 (#15). When the stocker controller H2 receives the information from the purge controller H1 that the nitrogen purging at the initial target flow rate L31 defined in the storage purge pattern P3 has been completed, the stocker controller H2 selects the identifying information of the container 50 stored in the purge shelf 10S from the inventory management data, and associates superordinate environment management information, "Purging completed" having identification number 13, with the identifying information of the container 50, and transmits it to the facility management device H3 (#16). Because the facility management device H3 receives information from the stocker controller H2 that the initial purging of the stored container 50 is started, and that it is completed, the facility management device H3 can prevent a carry out request from being issued in order to prevent the container 50 stored in the purge shelf 10S from being carried out while the initial purging of the container 50 is being performed.

When the initial purging is completed, the purge controller H1 causes the nitrogen purging (maintenance purging) to be continued at the steady-state target flow rate L32 defined in the storage purge pattern P3 for the set duration t4. Upon completion of the maintenance purging, the initial purging is started again. In this case, the content of the communication among the purge controller H1, the stocker controller H2, and the facility management device H3 is the same as the communication at the start and at the completion of the first initial purging described above.

Figure 7:
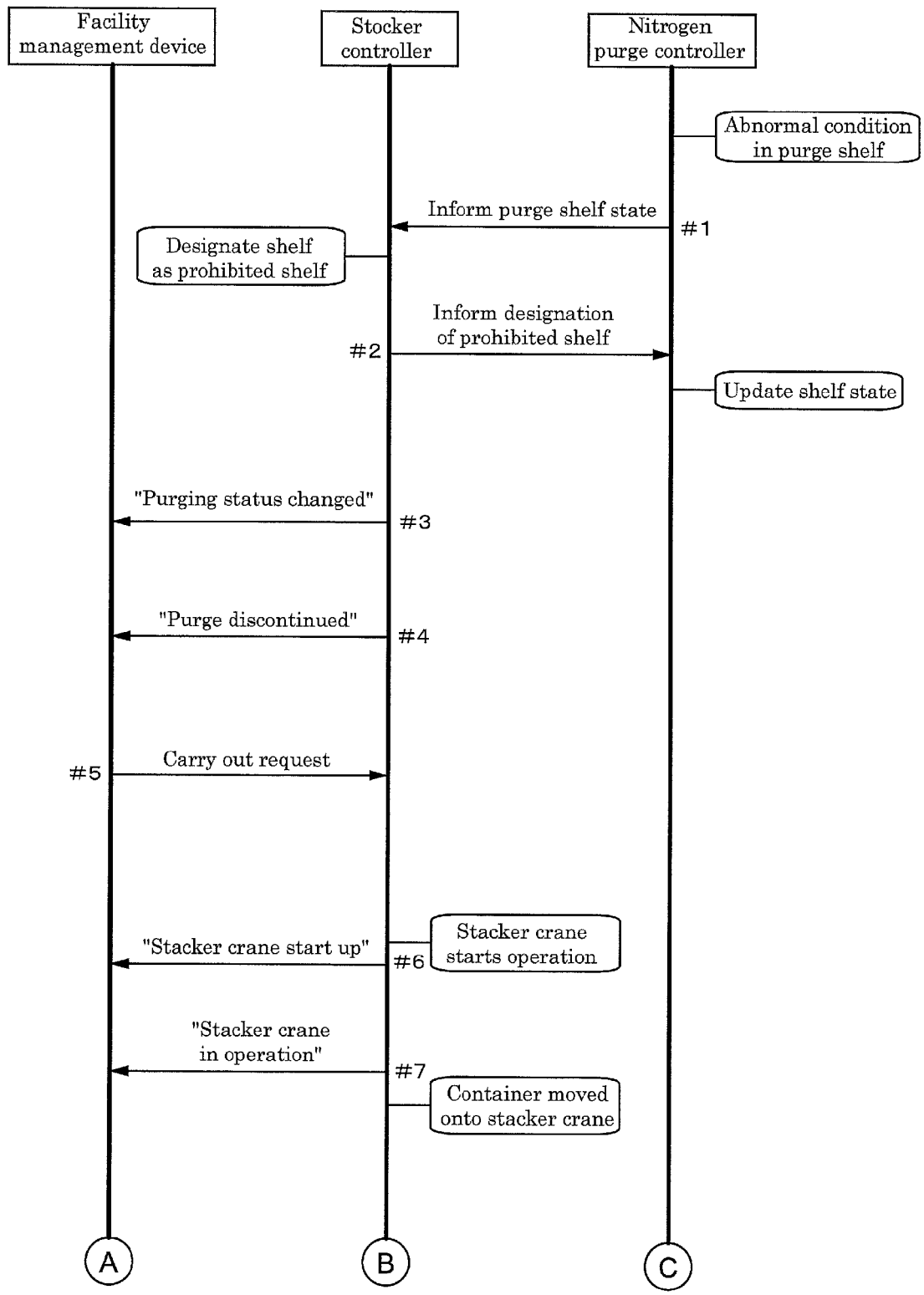
FIG. 7 shows an example of communication that takes place at the time of purge shelf failure.
Figure 8:
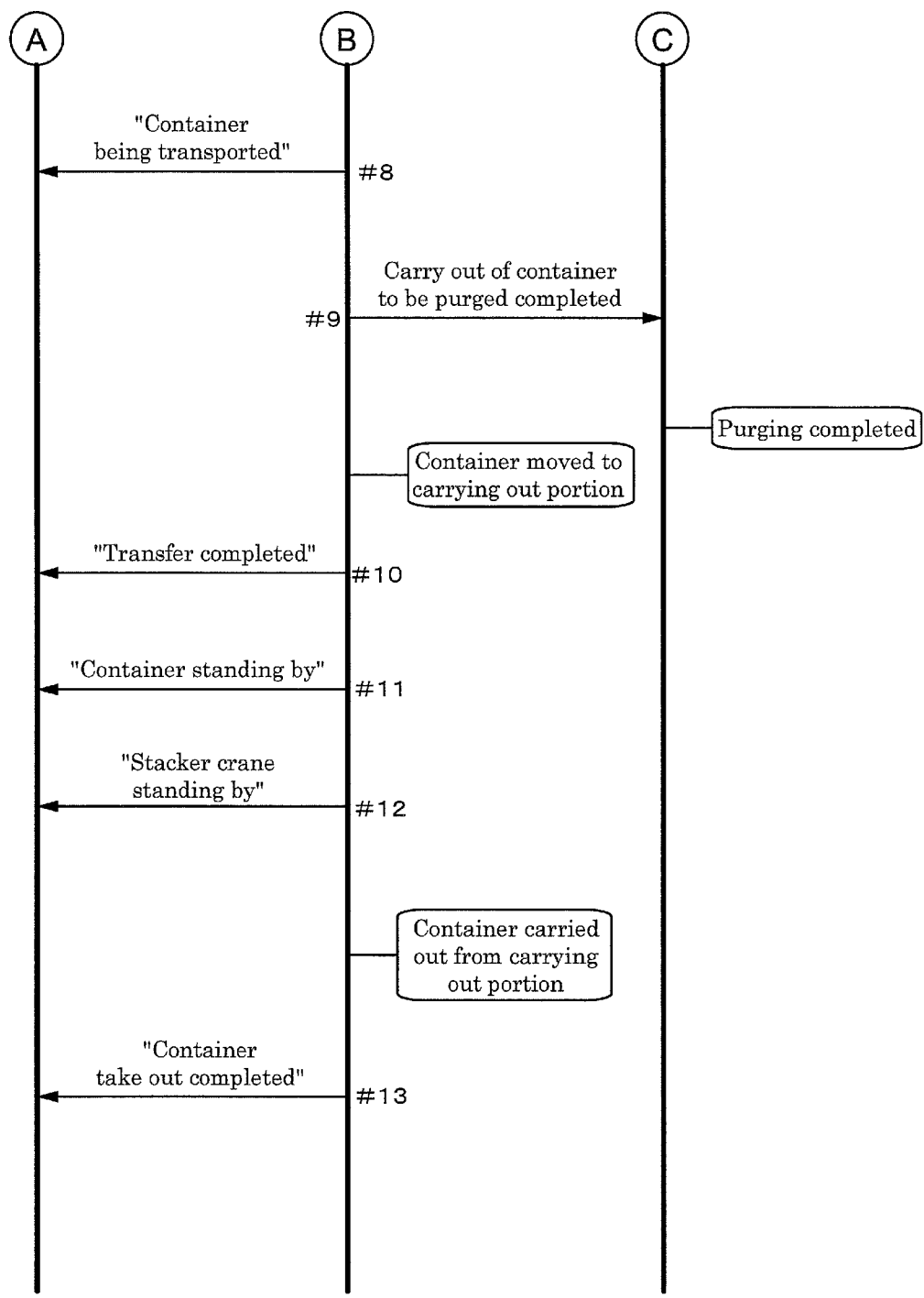
FIG. 8 shows the example of communication that takes place at the time of purge shelf failure.

Next, communication process in the event that an abnormal condition occurs to the inactive gas supplying device 4 of a purge shelf 10S is described with reference to FIGS. 7 and 8. When an abnormal condition occurs in a purge shelf 10S, the purge controller H1 informs the stocker controller H2 of purge shelf state which includes abnormal condition information (for example, abnormal condition of the mass flow controller 40 determined by the self-diagnosis function of the mass flow controller 40, inconsistency in the detection of the load presence sensors 10z, and abnormal condition of the programmable logic controller P, etc.) and performance information of the inactive gas supplying devices 4, such as supply pressure of nitrogen gas (#1). Upon receiving the purge shelf state, the stocker controller H2 designates the purge shelf 10S in which abnormal condition is indicated in the purge shelf state as a storage section 10S that is not to be used (referred to hereinafter as a prohibited shelf), and transmits information to this effect to the purge controller H1 (#2). This causes the purge shelf 10S designated as a prohibited shelf to be managed as a prohibited shelf also by the purge controller H1.

Upon designating a prohibited shelf, the stocker controller H2 transmits "Purging status changed" having identification number 14 to the facility management device H3 (#3), then selects the identifying information of the container 50 stored in the prohibited shelf from the inventory management data, and associates the superordinate environment management information, "Purging discontinued" having identification number 11, with the identifying information of the container 50, and transmits it to the facility management device H3 (#4). Upon receiving "Purging discontinued" from the stocker controller H2, the facility management device H3 transmits a carry out request to the stocker controller H2 based on the identifying information of the container 50 indicated by the superordinate environment management information in order to retrieve the container 50 specified by the identifying information from the storage rack or structure 10 (#5).

Upon receiving the carry out request, the stocker controller H2: searches for and finds the storage section 10S in which the container 50 to be carried out is stored from the inventory management data based on the identifying information of the container 50 that is the subject matter of the carry out request; and operates the stacker crane 20. When this happens, the stocker controller H2 sequentially transmits to the facility management device H3 the transport management information, "Stacker crane start up" having identification number 01, and "Stacker crane in operation" having identification number 02 (#6 and #7).

When the stacker crane 20 picks up the container 50 to be carried out in the purge shelf 10S, the stocker controller H2 transmits to the facility management device H3 transport management information, "Container being transported" having identification number 07 (#8), and transmits to the purge controller H1 that the container 50 to be carried out has been carried out from the purge shelf 10S (#9). Although the mass flow controller 40 in the prohibited shelf is in a supply stop state according to the detection made by the self-diagnosis function, the nitrogen purging has been continued for managing purposes; thus, the purge controller H1 causes the nitrogen purging in the prohibited shelf to be completed upon receiving the carry out completion report from the stocker controller H2.

As the container 20 is moved to the carrying out portion (the carry-in-and-out portion D in the present embodiment) by the stacker crane 20, the stocker controller H2 sequentially transmits to the facility management device H3 the transport management information, "Transfer completed" having identification number 03, "Container standing by" having identification number 06, and "Stacker crane standing by" having identification number 04 (#10-#12).

As the container 50 is taken out, or carried out, from the carrying out portion (carry-in-and-out portion D) by the ceiling transport vehicle 30, in order to report to the facility management device H3 that the container 50 to be carried out has been taken out, the stocker controller H2 associates the transport management information, "Container taken out" having identification number 09, with the identifying information of the container 50 and transmits it to the facility management device H3 (#13).

Alternative Embodiments

Finally, other embodiments of the storage system and storage method in accordance with the present invention are described. In addition, the arrangements disclosed in each of the following embodiments can also be used in combination with the arrangements disclosed in any other embodiment unless inconsistency arises.

(1) In the embodiment described above, an example is described in which the article holders are airtight containers which can store the articles that should be stored in an inactive gas atmosphere. However, The article holders may be, for example, article transport magazines for holding a plurality of rechargeable battery cells, or physical distribution pallets for receiving and supporting food and drinks that are stored in a proper temperature environment or their raw materials.

(2) In the embodiment described above, an example is described in which the environment adjuster is the inactive gas supplying device provided in each storage section. However, one environment adjuster may be arranged to serve more than one storage sections.

(3) In the embodiment described above, an example is described in which the storage structure is one whose periphery is defined and covered by the walls. However, the storage structure may be one without the walls.

(4) With respect to other arrangements, the embodiments disclosed in the present specification are provided for illustration purposes only in all respects. And it should be understood that the scope of the present invention is not limited by these embodiments. A person skilled in the art would easily understand that suitable changes and modifications may be made without departing from the spirit of the present invention. Therefore, any other embodiment with changes made without departing from the spirit of the present invention would naturally fall within the scope of the present invention.

What is claimed is:

1. A storage system comprising:
a storage structure having a plurality of storage sections for storing article holders for transporting articles and a carry-in-and-out portion for carrying in and carrying out the article holders;
one or more environment adjusters for adjusting a storage environment of the articles held by the article holders in the storage sections, wherein the adjusting is performed individually for each of the storage sections;
an environment managing portion for collecting information about the storage environment of the articles in each of the plurality of storage sections, and for controlling operation of the one or more environment adjusters;
a storage transport device for performing a carry out transport operation in which the article holder is transported from the storage section to the carry-in-and-out portion, and a carry in transport operation in which the article holder is transported from the carry-in-and-out portion to the storage section;
a primary managing device for outputting a carry out request for carrying out the article holder specified by identifying information provided to each of the article holders from the storage structure, and a carry in request for carrying in the article holder specified by the identifying information to the storage structure;
a carry-in-and-out managing device for managing locations of the storage sections in which the article holders are stored, by associating the locations of the storage sections in which the article holders are stored with the identifying information of the respective article holders, and for controlling the carry out transport operation or the carry in transport operation of the storage transport device based on the carry out request or the carry in request;
wherein the environment managing portion is configured to generate environment management information indicating the storage environment of the articles for each of the storage sections, and to output the environment management information to the carry-in-and-out managing device, and wherein the carry-in-and-out managing device is configured to generate superordinate environment management information in which the environment management information for each of the storage sections outputted by the environment managing portion is associated with the identifying information of the article holder stored in corresponding one of the storage sections, and is configured to output the superordinate environment management information to the primary managing device.

2. The storage system as defined in claim 1, wherein:
the carry-in-and-out managing device is also configured to generate transport management information which is information about the carry in transport operation and the carry out transport operation, and to output the transport management information to the primary managing device,
wherein a plurality of distinct transport management information is provided as the transport management information,
wherein a plurality of distinct superordinate environment management information is provided as the superordinate environment management information, and
wherein the carry-in-and-out managing device is configured to output the transport management information and the superordinate environment management information to the primary managing device with an information identifier that can be used to identify the transport management information and the superordinate environment management information.

3. The storage system as defined in claim 1, wherein:
the environment management information is information that indicates which one of a plurality of kinds of states defined in advance the storage environment of the articles has come to be in.

4. The storage system as defined in claim 1, wherein:
the environment management information includes information that indicates that an abnormal condition occurred in at least one of the one or more environment adjusters.

5. The storage system as defined in claim 1, wherein:
each of the article holders is an airtight container for storing articles which should be stored in an inactive gas atmosphere,
wherein each of the one or more environment adjusters has an inactive gas supplying device which supplies inactive gas to the container stored in the storage section,
wherein the environment management information includes information indicating that supplying of inactive gas to the container by the inactive gas supplying device is started or information that the supplying of the inactive gas to the container is completed.

6. A storage method utilizing a storage system, the storage system including:
a storage structure having a plurality of storage sections for storing article holders for transporting articles, and
a carry-in-and-out portion for carrying in and carrying out the article holders,
one or more environment adjusters for adjusting a storage environment of the articles held by the article holders in the storage sections, wherein the adjusting is performed individually for each of the storage sections,
an environment managing portion for collecting information about the storage environment of the articles in each of the plurality of storage sections, and for controlling operation of the one or more environment adjusters,
a storage transport device for performing a carry out transport operation in which the article holder is transported from the storage section to the carry-in-and-out portion, and a carry in transport operation in which the article holder is transported from the carry-in-and-out portion to the storage section, a primary managing device for outputting a carry out request for carrying out the article holder specified by identifying information provided to each of the article holders from the storage structure, and a carry in request for carrying in the article holder specified by the identifying information to the storage structure, and a carry-in-and-out managing device for managing locations of the storage sections in which the article holders are stored, by associating the locations of the storage sections in which the article holders are stored with the identifying information of the respective article holders, and for controlling the carry out transport operation or the carry in transport operation of the storage transport device based on the carry out request or the carry in request, wherein the environment managing portion is configured to generate environment management information indicating the storage environment of the articles for each of the storage sections, and to output the environment management information to the carry-in-and-out managing device, the storage method comprising the following step that is performed by the carry-in-and-out managing device:

an information output step of generating superordinate environment management information in which the environment management information for each of the storage sections outputted by the environment managing portion is associated with the identifying information of the article holder stored in corresponding one of the storage sections, and outputting the superordinate environment management information to the primary managing device.

7. The storage method as defined in claim 6, wherein:

the information output step further includes generating transport management information which is information about the carry in transport operation and the carry out transport operation, and outputting the transport management information to the primary managing device, wherein a plurality of distinct transport management information is provided as the transport management information, wherein a plurality of distinct superordinate environment management information is provided as the superordinate environment management information, and wherein in the information output step, the transport management information and the superordinate environment management information are outputted to the primary managing device with an information identifier that can be used to identify the transport management information and the superordinate environment management information.

8. The storage method as defined in claim 6, wherein:

the environment management information is information that indicates which one of a plurality of kinds of states defined in advance the storage environment of the articles has come to be in.

9. The storage method as defined in claim 6, wherein:

the environment management information includes information that indicates that an abnormal condition occurred in at least one of the one or more environment adjusters.

10. The storage method as defined in claim 6, wherein:

each of the article holders is an airtight container for storing articles which should be stored in an inactive gas atmosphere, wherein each of the one or more environment adjusters has an inactive gas supplying device which supplies inactive gas to the container stored in the storage section, and wherein the environment management information includes information indicating that supplying of inactive gas to the container by the inactive gas supplying device is started or information that the supplying of the inactive gas to the container is completed.

* * * * *